US012690305B2

(12) United States Patent
Hsiao et al.

(10) Patent No.: US 12,690,305 B2
(45) Date of Patent: Jul. 21, 2026

(54) MICRO SEMICONDUCTOR DEVICE AND MICRO SEMICONDUCTOR STRUCTURE

(71) Applicant: PlayNitride Display Co., Ltd., MiaoLi County (TW)

(72) Inventors: Yu-Hsuan Hsiao, MiaoLi County (TW); Teng-Hsien Lai, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 667 days.

(21) Appl. No.: 18/070,396

(22) Filed: Nov. 28, 2022

(65) Prior Publication Data

US 2024/0162201 A1 May 16, 2024

(30) Foreign Application Priority Data

Nov. 15, 2022 (TW) .................................. 111143488

(51) Int. Cl.
*H10H 20/841* (2025.01)
*H10H 20/01* (2025.01)
(Continued)

(52) U.S. Cl.
CPC ........ *H10H 20/841* (2025.01); *H10H 20/018* (2025.01); *H10W 90/00* (2026.01); *H10H 20/857* (2025.01)

(58) Field of Classification Search
None
See application file for complete search history.

(56) References Cited

U.S. PATENT DOCUMENTS 6,310,315 B1 * 10/2001 Tayebati .............. B23K 26/035
219/121.64
2003/0047744 A1 * 3/2003 Yanamoto .............. B82Y 20/00
257/98

(Continued)

FOREIGN PATENT DOCUMENTS

CN 103500745 A 1/2014
CN 105720141 6/2016
(Continued)

OTHER PUBLICATIONS

Mar, A et al 2014, 'Young's modulus extraction of epitaxial heterostructure AlGaN/GaN for MEMS application', Physica Status Solidi, vol. 211, No. 7, pp. 1655-1659. (Year: 2014).*
(Continued)

*Primary Examiner* — Feifei Yeung Lopez
(74) *Attorney, Agent, or Firm* — JCIPRNET

(57) ABSTRACT

A micro semiconductor device includes an epitaxial structure and an optical layer. The optical layer is disposed on the epitaxial structure. The optical layer is a multi-layer film structure including a first film layer, a second film layer, and a third film layer disposed between the first film layer and the second film layer. A refractive index of the first film layer and a refractive index of the second film layer are both greater than a refractive index of the third film layer. A thickness of the third film layer is greater than a thickness of the first film layer and s thickness of the second film layer. A reflectivity of the optical layer to an external light of the micro semiconductor device is greater than a self-luminescence of the epitaxial structure of the micro semiconductor device.

11 Claims, 8 Drawing Sheets

(51) Int. Cl.
    *H10W 90/00*     (2026.01)
    *H10H 20/857*   (2025.01)

(56)          References Cited

U.S. PATENT DOCUMENTS

| | | | |
|---|---|---|---|
| 2015/0380439 A1* | 12/2015 | Chen ................ | H10D 86/0212 |
| | | | 257/72 |
| 2020/0274036 A1* | 8/2020 | Le Blevennec ........ | C09K 11/70 |
| 2020/0402867 A1* | 12/2020 | Yanagawa ............ | H01L 25/167 |
| 2023/0011230 A1* | 1/2023 | Busani ................... | H01S 5/341 |

FOREIGN PATENT DOCUMENTS

| | | |
|---|---|---|
| CN | 109244111 | 1/2019 |
| CN | 111293201 | 6/2020 |
| CN | 113299804 | 8/2021 |
| CN | 113808980 | 12/2021 |
| CN | 114975725 | 8/2022 |
| TW | 201145560 | 12/2011 |
| TW | I775223 | 8/2022 |

OTHER PUBLICATIONS

"Office Action of China Counterpart Application", issued on Jun. 17, 2025, p. 1-p. 8.
"Office Action of Taiwan Counterpart Application", issued on Jan. 5, 2024, p. 1-p. 3.
"Office Action of China counterpart Application", issued on Sep. 25, 2025, p. 1-p. 8.

* cited by examiner

1

MICRO SEMICONDUCTOR DEVICE AND MICRO SEMICONDUCTOR STRUCTURE

CROSS-REFERENCE TO RELATED APPLICATION

This application claims the priority benefit of Taiwan application serial no. 111143488, filed on Nov. 15, 2022. The entirety of the above-mentioned patent application is hereby incorporated by reference herein and made a part of this specification.

BACKGROUND

Technical Field

The disclosure relates to a semiconductor device and semiconductor structure, and more particularly, to a micro semiconductor device and a micro semiconductor structure.

Description of Related Art

Laser transfer technique is one of the mainstream transfer techniques for mass transfer of micro semiconductor devices. Laser itself is a high-energy collimated light source. Even if it is focused on a specific removing film layer, a part of the light source will still scatter into the epitaxial structure, which affects chip characteristics and reliability.

SUMMARY

The disclosure provides a micro semiconductor device with better structural reliability.

The disclosure further provides a micro semiconductor structure including the above-mentioned micro semiconductor device, which has better structural reliability.

The micro semiconductor device of the disclosure includes an epitaxial structure and an optical layer. The optical layer is disposed on the epitaxial structure. The optical layer is a multi-layer film structure including a first film layer, a second film layer, and a third film layer disposed between the first film layer and the second film layer. A refractive index of the first film layer and a refractive index of the second film layer are both greater than a refractive index of the third film layer. A thickness of the third film layer is greater than a thickness of the first film layer and a thickness of the second film layer. A reflectivity of the optical layer to an external light of the micro semiconductor device is greater than a self-luminescence of the epitaxial structure of the micro semiconductor device.

The micro semiconductor structure of the disclosure includes a substrate and at least one micro semiconductor device. The micro semiconductor device is disposed on the substrate, and the micro semiconductor device includes an epitaxial structure and an optical layer. The optical layer is disposed on the epitaxial structure. The optical layer is a multi-layer film structure including a first film layer, a second film layer, and a third film layer disposed between the first film layer and the second film layer. A refractive index of the first film layer and a refractive index of the second film layer are both greater than a refractive index of the third film layer. A thickness of the third film layer is greater than a thickness of the first film layer and a thickness of the second film layer. A reflectivity of the optical layer to an external light of the micro semiconductor device is greater than a self-luminescence of the epitaxial structure of the micro semiconductor device.

Based on the above, in the micro semiconductor device of the disclosure, the optical layer is disposed on the epitaxial structure. A reflectivity of the optical layer to an external light of the micro semiconductor device is greater than a self-luminescence of the epitaxial structure of the micro semiconductor device. In this way, the impact of external light on the epitaxial structure may be minimized to ensure the characteristics of the epitaxial structure, so that the micro semiconductor device of the disclosure has better structural reliability.

In order to make the above-mentioned features and advantages of the disclosure comprehensible, embodiments accompanied with drawings are described in detail below.

DESCRIPTION OF THE EMBODIMENTS

Figure 1A:
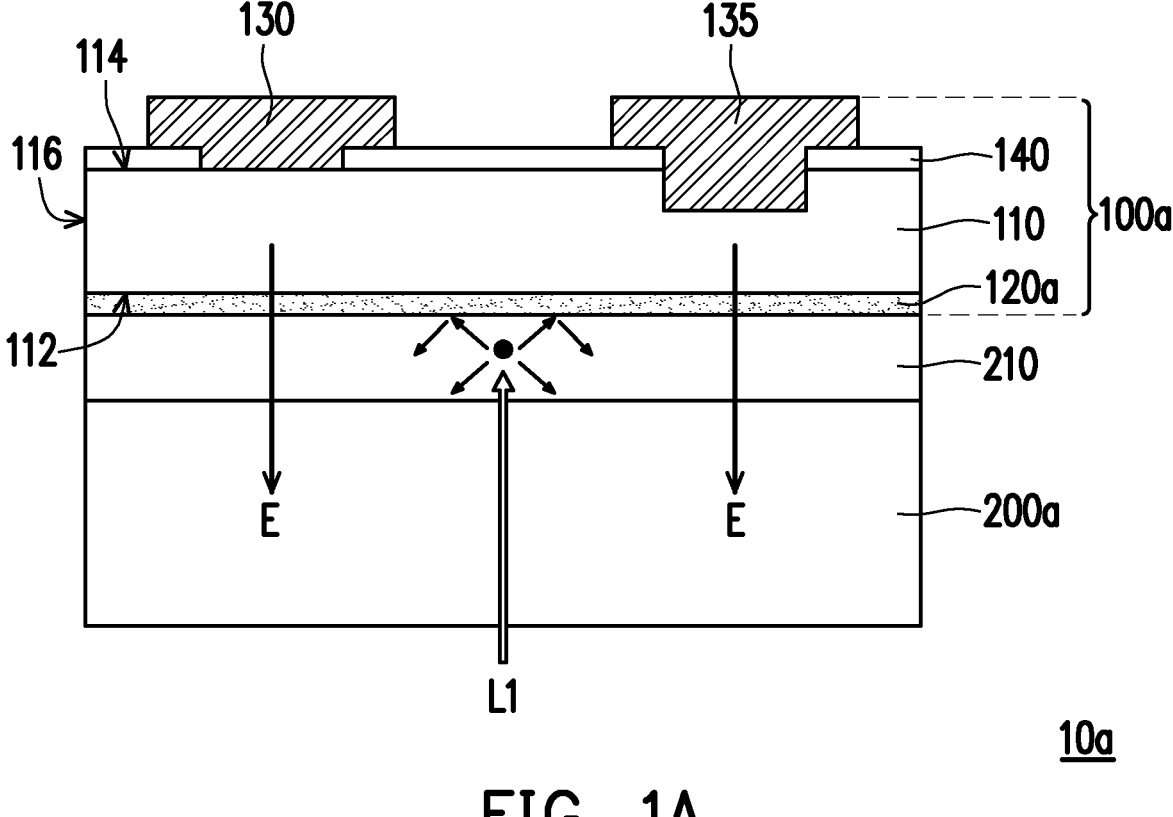
FIG. 1A is a cross-sectional schematic view of a micro semiconductor structure according to an embodiment of the disclosure.
Figure 1B:
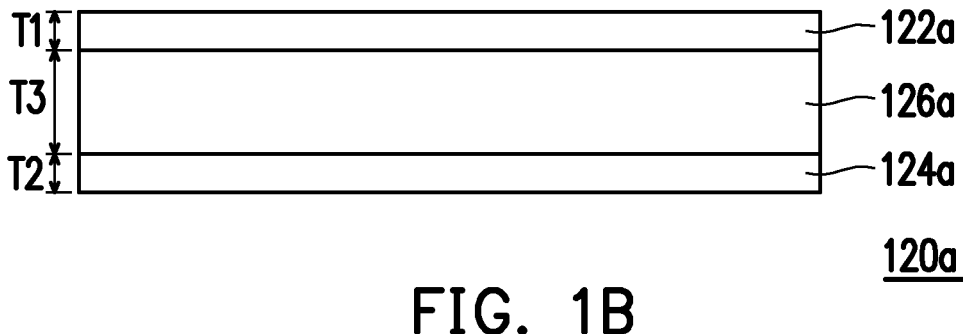
FIG. 1B is an enlarged schematic view of the optical layer in FIG. 1A.

FIG. 1A is a cross-sectional schematic view of a micro semiconductor structure according to an embodiment of the disclosure. FIG. 1B is an enlarged schematic view of the optical layer in FIG. 1A. Referring to FIG. 1A and FIG. 1B at the same time, in this embodiment, a micro semiconductor structure 10a includes a substrate 200a and at least one micro semiconductor device (a micro semiconductor device 100a is schematically shown). The micro semiconductor device 100a is disposed on the substrate 200a, and the micro semiconductor device 100a includes an epitaxial structure 110 and an optical layer 120a. The optical layer 120a is disposed on the epitaxial structure 110. The optical layer 120a is a multi-layer film structure including a first film layer 122a, a second film layer 124a, and a third film layer 126a disposed between the first film layer 122a and the second film layer 124a. A refractive index of the first film layer 122a and a refractive index of the second film layer 124$a$ are both greater than a refractive index of the third film layer 126$a$. A thickness T3 of the third film layer 126$a$ is greater than a thickness T1 of the first film layer 122$a$ and a thickness T2 of the second film layer 124$a$. A reflectivity of the optical layer 120$a$ to an external light L1 of the micro semiconductor device 100$a$ is greater than a self-luminescence E of the epitaxial structure 110 of the micro semiconductor device 100$a$. In particular, the illustration of the N and P type semiconductor layers and the light emitting layer of the epitaxial structure 110 is omitted here. The self-luminescence E is the light emitted from the internal of the epitaxial structure 110. The external light L1 is the light of the laser light or an external ambient light configured to transfer the micro semiconductor device 100$a$ instead of the light emitted by the epitaxial structure 110, which is not limited herein.

Specifically, in this embodiment, the substrate 200$a$ is embodied as a temporary substrate including a sacrificial layer 210. The sacrificial layer 210 is disposed between optical layer 120$a$ and the substrate 200$a$. The Young's modulus of the optical layer 120$a$ is greater than a Young's modulus of the sacrificial layer 210. In subsequent process, the substrate 200$a$ and the sacrificial layer 210 may be removed, leaving the micro semiconductor device 100$a$, so the current micro semiconductor structure 10$a$ belongs to a Chip on Carrier (COC) form.

Referring to FIG. 1A again, the epitaxial structure 110 of this embodiment has an upper surface 112 and a lower surface 114 opposite to other and a peripheral surface 116 connecting the upper surface 112 and the lower surface 114. The optical layer 120$a$ is disposed on the upper surface 112 of the epitaxial structure 110, and the self-luminescence E emerges from the upper surface 112, which means that the upper surface 112 is a light-emitting surface. The micro semiconductor device 100$a$ may further include an electrode 130, an electrode 135, and a protective layer 140. The electrode 130, the electrode 135, and the protective layer 140 are all disposed on the lower surface 114 of the epitaxial structure 110. The protective layer 140 is located between the electrode 130, the electrode 135, and the epitaxial structure 110. The electrode 130 and the electrode 135 are electrically connected to the epitaxial structure 110, respectively, through the protective layer 140. The electrode 130 and the electrode 135 herein are located on the same side of the epitaxial structure 110. Thus, the micro semiconductor device 100$a$ is embodied as a horizontal micro semiconductor device, such as a horizontal micro light emitting diode. In addition, the material of the protective layer 140 is, for example, an inorganic material for insulation and protection, such as silicon dioxide ($SiO_2$) or silicon nitride (SiN), but not limited thereto.

Referring to FIG. 1A and FIG. 1B at the same time again, the optical layer 120$a$ may be produced through a physical or chemical vapor deposition process after the epitaxial structure 110 is removed from a growing substrate (not shown). The refractive index of the first film layer 122$a$ of the optical layer 120$a$ is, for example, 1.9 to 2.8. The thickness T1 of the first film layer 122$a$ is, for example, from 10 nanometers to 30 nanometers. The material of the first film layer 122$a$ is, for example, titanium dioxide ($TiO_2$), tantalum pentoxide ($Ta_2O_5$), niobium pentoxide ($Nb_2O_5$), or hafnium oxide ($HfO_2$), but not limited thereto. The refractive index of the second film layer 124$a$ of the optical layer 120$a$ is, for example, 1.9 to 2.8. The thickness T2 of the second film layer 124$a$ is, for example, from 10 nanometers to 30 nanometers. The material of the second film layer 124$a$ is, for example, titanium dioxide ($TiO_2$), tantalum pentoxide ($Ta_2O_5$), niobium pentoxide ($Nb_2O_5$), or hafnium oxide ($HfO_2$), but not limited thereto. In an embodiment, the refractive index, the thickness, and the material of the first film layer 122$a$ and the second film layer 124$a$ are the same. In an embodiment, at least one of the refractive index, the thickness, and the material of the first film layer 122$a$ and the second film layer 124$a$ is different. The refractive index of the third film layer 126$a$ of the optical layer 120$a$ is, for example, 1.4 to 1.8. The thickness T3 of the third film layer 126$a$ is, for example, from 35 nanometers to 75 nanometers. The material of the third film layer 126$a$ is, for example, silicon dioxide ($SiO_2$), aluminum oxide ($Al_2O_3$), or magnesium fluoride ($MgF_2$), but not limited thereto. That is to say, the greater the refractive index of the film layer, the thinner the thickness of the film layer. In particular, the stacking of the first film layer 122$a$, the second film layer 124$a$, and the third film layer 126$a$ of this embodiment may form a long wave pass (LWP) effect.

In an embodiment, the optical layer 120$a$ may reflect ultraviolet laser wavelength used for transferring. Specifically, in response to the wavelength of the external light L1 being, for example, from 240 nanometers to 400 nanometers, a band (e.g., full width at half maximum (FWHM) less than 2 nanometers) within this wavelength range has a better reflectivity, which is at least greater than 60%. In response to the optical layer 120$a$ being in a visible light band (e.g., the wavelength from 420 nanometers to 700 nanometers), good transmittance is provided and the transmittance herein is greater than 70%. In other words, the reflectivity is less than 30%. Thus, the reflectivity of the external light L1 is greater than twice the reflectivity of the self-luminescence E of the micro semiconductor device 100$a$. In an embodiment, the external light L1 may be, for example, an excimer laser, such as a 248-nanometer krypton fluoride (KrF) excimer laser or a diode pumped solid state laser (DPSS), but not limited thereto. In addition, the optical layer 120$a$ of this embodiment has, for example, a cut-off wavelength from 380 nanometers to 440 nanometers, which may increase the reflection of the external light L1 more effectively.

In short, since the optical layer 120$a$ of this embodiment is disposed on the light-emitting surface of the epitaxial structure 110 (i.e., on the upper surface 112), the reflectivity of the optical layer 120$a$ to the external light L1 of the micro semiconductor device 100$a$ is greater than the self-luminescence E of the epitaxial structure 110 of the micro semiconductor device 100$a$. In this way, in the laser transfer process, the external light L1 (e.g., ultraviolet laser) may separate the sacrificial layer 210 and the substrate 200$a$ thereon from the optical layer 120$a$. Moreover, the disposition of the optical layer 120$a$ may minimize the impact of laser scattered light to ensure the characteristics of the epitaxial structure 110, so that the micro semiconductor structure 10$a$ of the disclosure has better structural reliability. Furthermore, the design of the above optical layer 120$a$ also allows the laser process to have a larger room for parameter adjustment, which is adapted for the transfer technique that needs to flip the process multiple times. For example, a laser with a slightly higher intensity may be used for transferring without damaging the epitaxial structure 110. In addition, the substrate 200$a$ and the sacrificial layer 210 of this embodiment may be removed, so the thickness of the material of the sacrificial layer 210 may be reduced. That is, without making the material very thick to avoid laser erosion of the epitaxial structure 110, the removal efficiency may be increased and the laser power used may be reduced.

It is worth mentioning that the structural formation of the optical layer 120$a$ is not limited by this embodiment.

Although a three-layer film layer is used as an example for illustration, in other embodiments, the number of film layers of the optical layer may also be more than three layers.

Figure 1C:
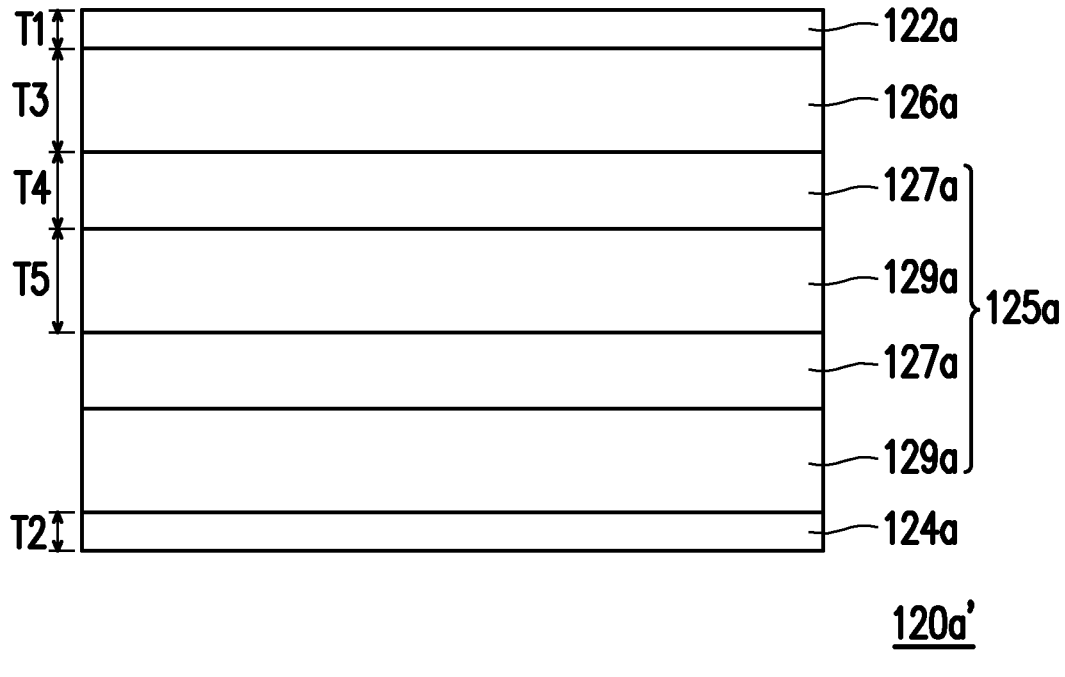
FIG. 1C is an enlarged schematic view of an optical layer of another embodiment.

FIG. 1C is an enlarged schematic view of an optical layer of another embodiment. Referring to FIG. 1B and FIG. 1C at the same time, the optical layer 120a of this embodiment is similar to the optical layer 120 of FIG. 1B, and the difference between the two is that in this embodiment, the optical layer 120a further includes an optical stacking layer 125a disposed between the first film layer 122a and the second film layer 124a. In addition, at least one high refractive index layer (two layers of high refractive index layer 127a are schematically shown) and at least one low refractive index layer (two layers of low refractive index layer 129a are schematically shown) are disposed in pairs and alternately. A thickness T5 of the low refractive index layer 129a is greater than a thickness T4 of the high refractive index layer 127a. One high refractive index layer 127a and one low refractive index layer 129a are stacked to form a pair. Since two high refractive index layers 127a and two low refractive index layers 129 are stacked alternately, as described above, thus forming two pairs.

Specifically, in this embodiment, the optical stacking layer 125a is disposed between the third film layer 126a and the second film layer 124a. The third film layer 126a is located between the first film layer 122a and one high refractive index layer 127a of the optical stacking layer 125a, but not limited thereto. In another embodiment, the optical stacking layer 125a may also be disposed between the first film layer 122a and the third film layer 126a. The third film layer 126a is located between the second film layer 124a and one low refractive index layer of the optical stacking layer 125a. Specifically, the third film layer 126a and the optical stacking layer 125a may form one high refractive layer and one low refractive index layer, but not limited thereto. The refractive index of the high refractive index layer 127a of the optical stacking layer 125a is, for example, 1.9 to 2.8. The thickness T4 of the high refractive index layer 127a is, for example, from 20 nanometers to 60 nanometers. The material of the high refractive index layer 127a is, for example, titanium dioxide ($TiO_2$), tantalum pentoxide ($Ta_2O_5$), niobium pentoxide ($Nb_2O_5$), or hafnium oxide ($HfO_2$), but not limited thereto. The refractive index of the low refractive index layer 129a of the optical stacking layer 125a is, for example, 1.4 to 1.8. The thickness T5 of the low refractive index layer 129a is, for example, from 35 nanometers to 75 nanometers. The material of the low refractive index layer 129a is, for example, silicon dioxide ($SiO_2$), aluminum oxide ($Al_2O_3$), or magnesium fluoride ($MgF_2$), but not limited thereto. The thickness T1 of the first film layer 122a or the thickness T2 of the second film layer 124a is 60% or less of the thickness T4 of the high refractive index layer 127a, e.g., 50%, preferably.

In addition, this embodiment does not limit the number of layers of the optical stacking layer 125a. Although two pairs (i.e., two high refractive index layers 127a and two low refractive index layers 129a stacked alternately) are used as an example for illustration herein, in other embodiments, there may be only one pair (i.e., one high refractive index layer 127a and one low refractive index layer 129a). Alternatively, there may be more than three pairs of film layers, which still belongs to the scope of protection of this embodiment. It is worth mentioning that in an embodiment, the first film layer 122a, the second film layer 124a, the third film layer 126a, and the optical stacking layer 125a may also be finished by the same process, which may save processing time.

Since the optical stacking layer 125a in the optical layer 120a' may be formed by alternately stacking materials with different refractive indexes and different thicknesses, the reflectivity to the external light L1 (e.g., ultraviolet laser, please refer to FIG. 1A) may be improved through film layer parameter optimization.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
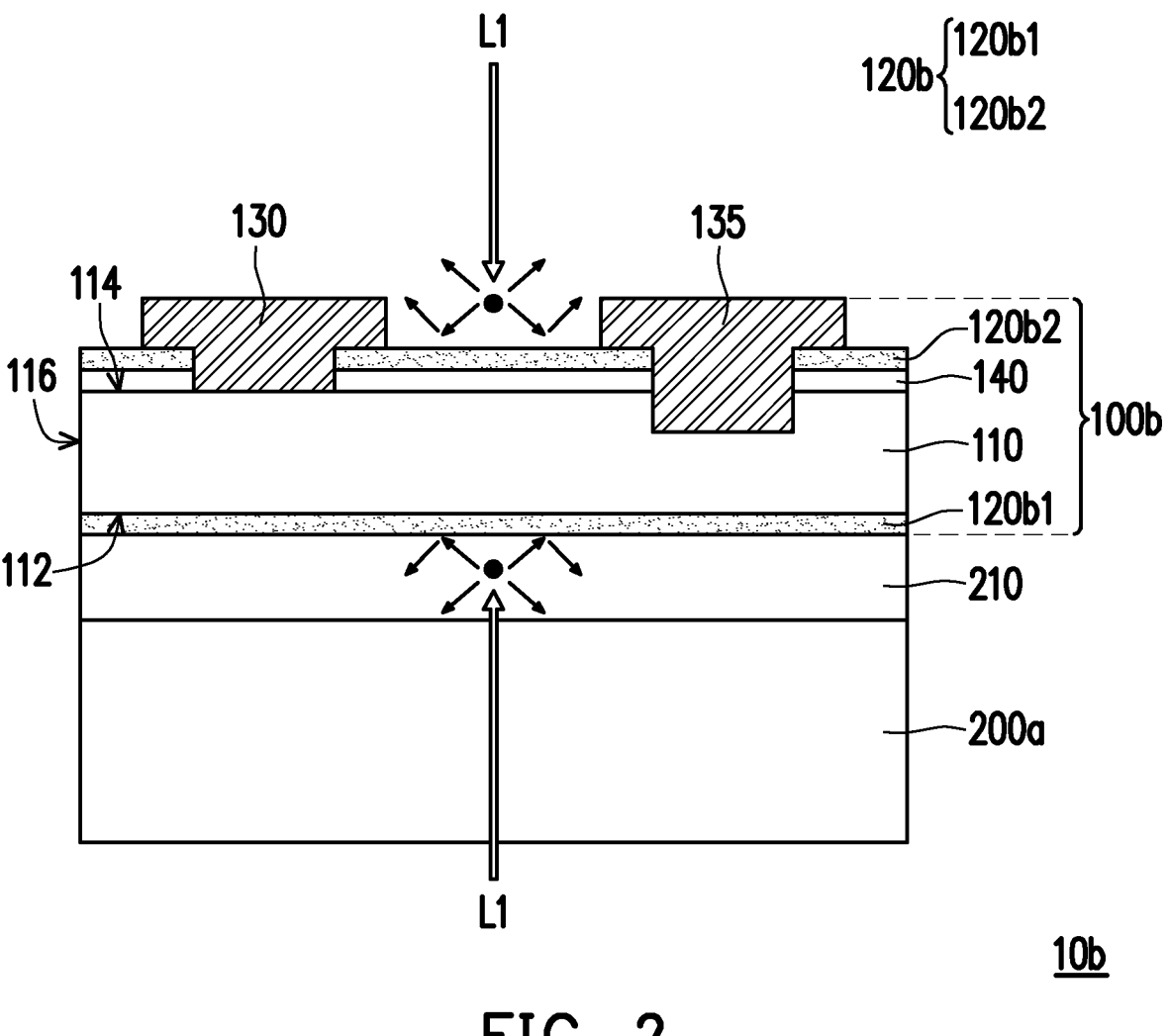
FIG. 2 is a cross-sectional schematic view of a micro semiconductor structure according to another embodiment of the disclosure.

FIG. 2 is a cross-sectional schematic view of a micro semiconductor structure according to another embodiment of the disclosure. Referring to FIG. 1A and FIG. 2 at the same time, the micro semiconductor structure 10b of this embodiment is similar to the micro semiconductor structure 10a of FIG. 1A, and the difference between the two is that in this embodiment, the optical layer 120b of the micro semiconductor device 100b includes a first sub-optical layer 120b1 and a second sub-optical layer 120b2. The first sub-optical layer 120b1 is located on the upper surface 112 of the epitaxial structure 110, and the second sub-optical layer 120b2 is located on the lower surface 114 of the epitaxial structure 110. The protective layer 140 is located between the second sub-optical layer 120b2 and the epitaxial structure 110. In short, since the optical layer 120b of this embodiment is disposed on the light-emitting surface (i.e., upper surface 112) and an electrode surface (i.e., lower surface 114) at the same time, no matter which side of the micro semiconductor device 100b is processed by laser (i.e., injecting the external light L1 into the upper surface 112 or the lower surface 114), the epitaxial structure 110 is effectively protected. Thus, the micro semiconductor structure 10b of this embodiment is provided with better structural reliability. In an embodiment not shown, the optical layer may also be used as the protective layer, and the production of the protective layer is omitted.

Figure 3:
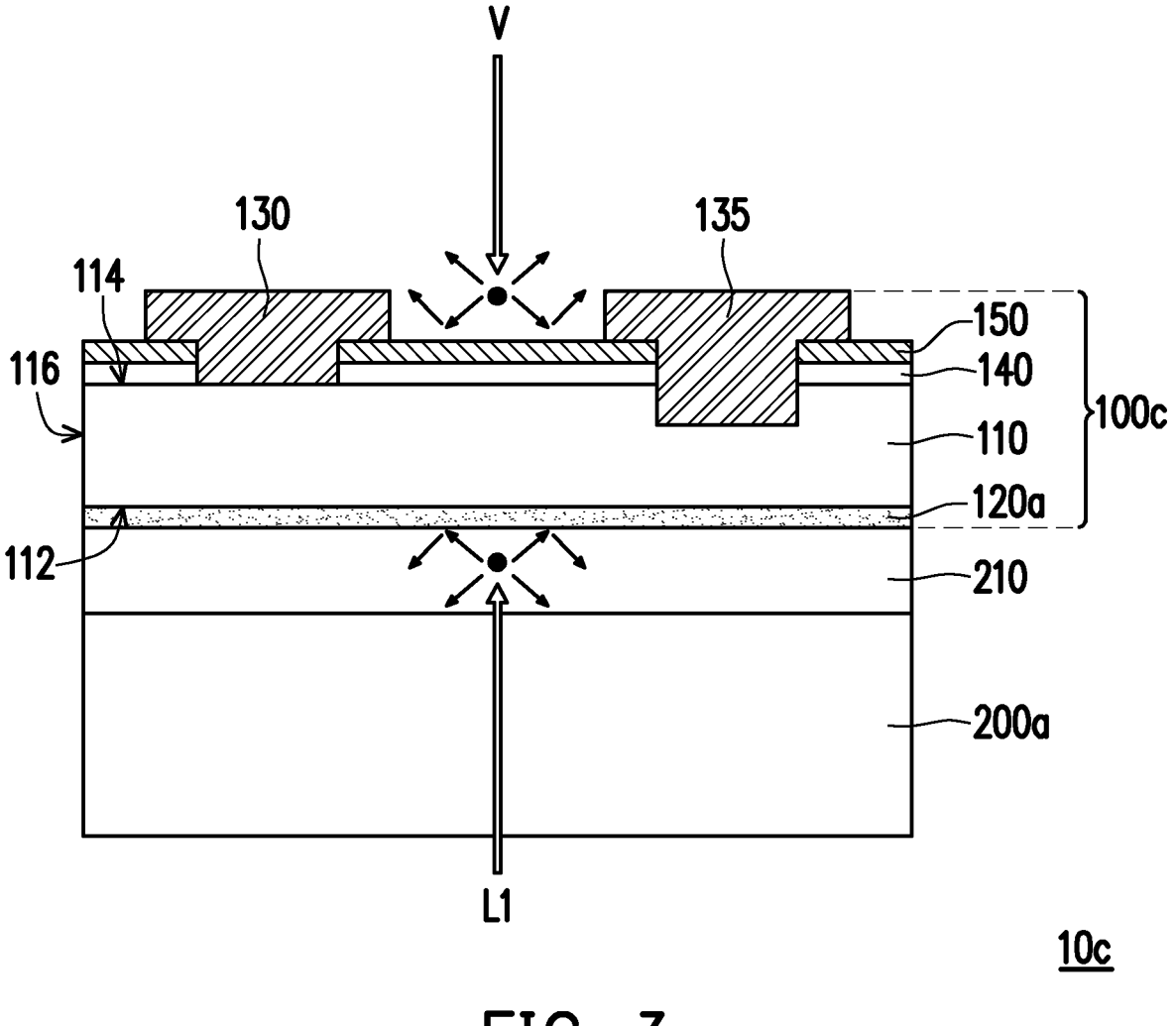
FIG. 3 is a cross-sectional schematic view of a micro semiconductor structure according to another embodiment of the disclosure.

FIG. 3 is a cross-sectional schematic view of a micro semiconductor structure according to another embodiment of the disclosure. Referring to FIG. 1A and FIG. 3 at the same time, the micro semiconductor structure 10c of this embodiment is similar to the micro semiconductor structure 10a of FIG. 1A, and the difference between the two is that in this embodiment, the micro semiconductor device 100c further includes a visible light reflective layer 150. The visible light reflective layer 150 is disposed on the lower surface 114 (i.e., electrode surface). Since the optical layer 120a of this embodiment is disposed on the light-emitting surface of the epitaxial structure 110 (i.e., upper surface 112), and the visible light reflective layer 150 is disposed on the electrode surface of the epitaxial structure 110 (i.e., lower surface 114), the external light L1 (e.g., ultraviolet laser) and a visible light V may be reflected. The visible light reflective layer 150 is, for example, a Bragg reflective layer, which reflects the light from the epitaxial structure 110 to the electrode surface to increase the light output and avoid interference of the external visible light V. In another embodiment, the visible light reflective layer 150 may also be disposed on the upper surface 112 of the epitaxial structure 110, and the optical layer 120a is disposed on the lower surface 114 of the epitaxial structure 110.

Figure 4:
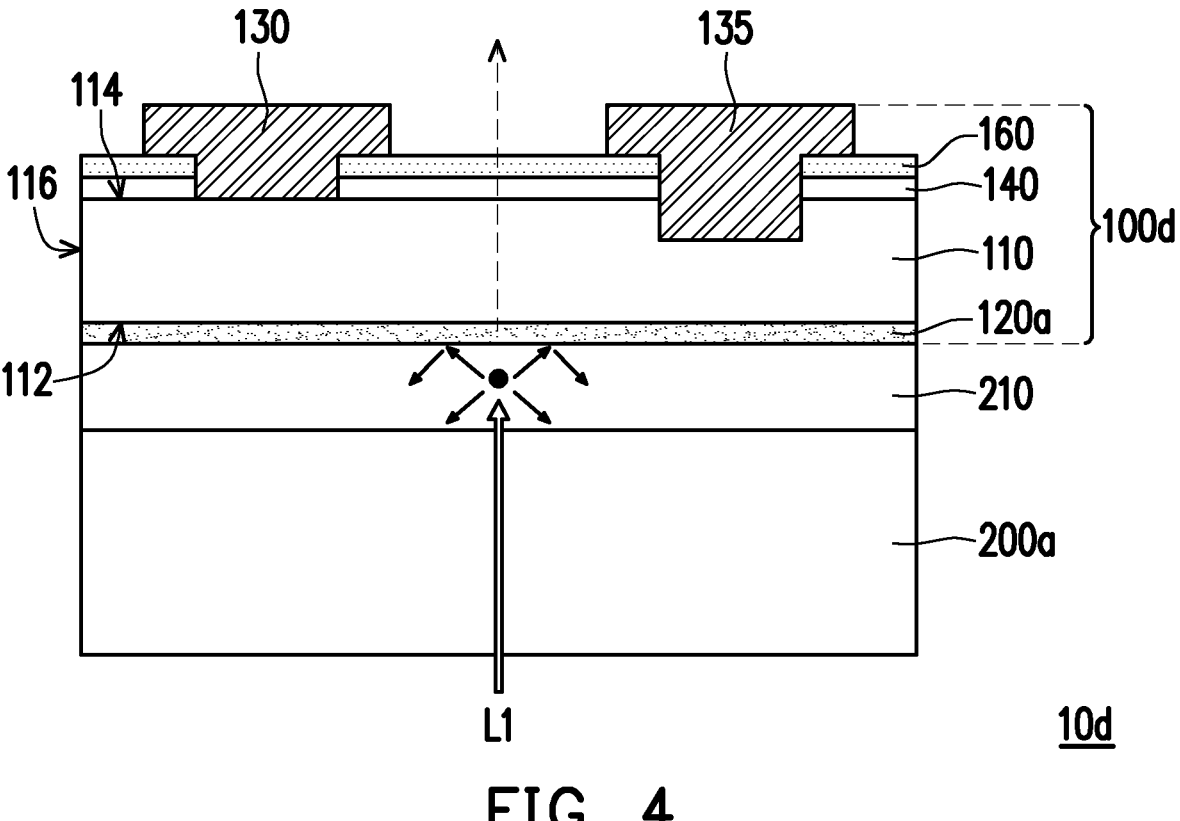
FIG. 4 is a cross-sectional schematic view of a micro semiconductor structure according to another embodiment of the disclosure.

FIG. 4 is a cross-sectional schematic view of a micro semiconductor structure according to another embodiment of the disclosure. Referring to FIG. 1A and FIG. 4 at the same time, the micro semiconductor structure 10*d* of this embodiment is similar to the micro semiconductor structure 10*a* of FIG. 1A, and the difference between the two is that in this embodiment, the micro semiconductor device 100*d* further includes an external light transmitting layer 160 disposed on the lower surface 114 (i.e., electrode surface). Since the optical layer 120*a* of this embodiment is disposed on the light-emitting surface of the epitaxial structure 110 (i.e., upper surface 112), and the external light transmitting layer 160 is disposed on the electrode surface of the epitaxial structure 110 (i.e., lower surface 114), the external light L1 (e.g., ultraviolet laser in ultraviolet light band) that has accidentally entered the epitaxial structure 110 may be released and not reflected in again. In an embodiment, the visible light reflective layer 150 as shown in FIG. 3 may also be disposed on the lower surface 114, such as a distributed Bragg reflector (DBR) that reflects the visible light and allow ultraviolet light to pass through.

Figure 5:
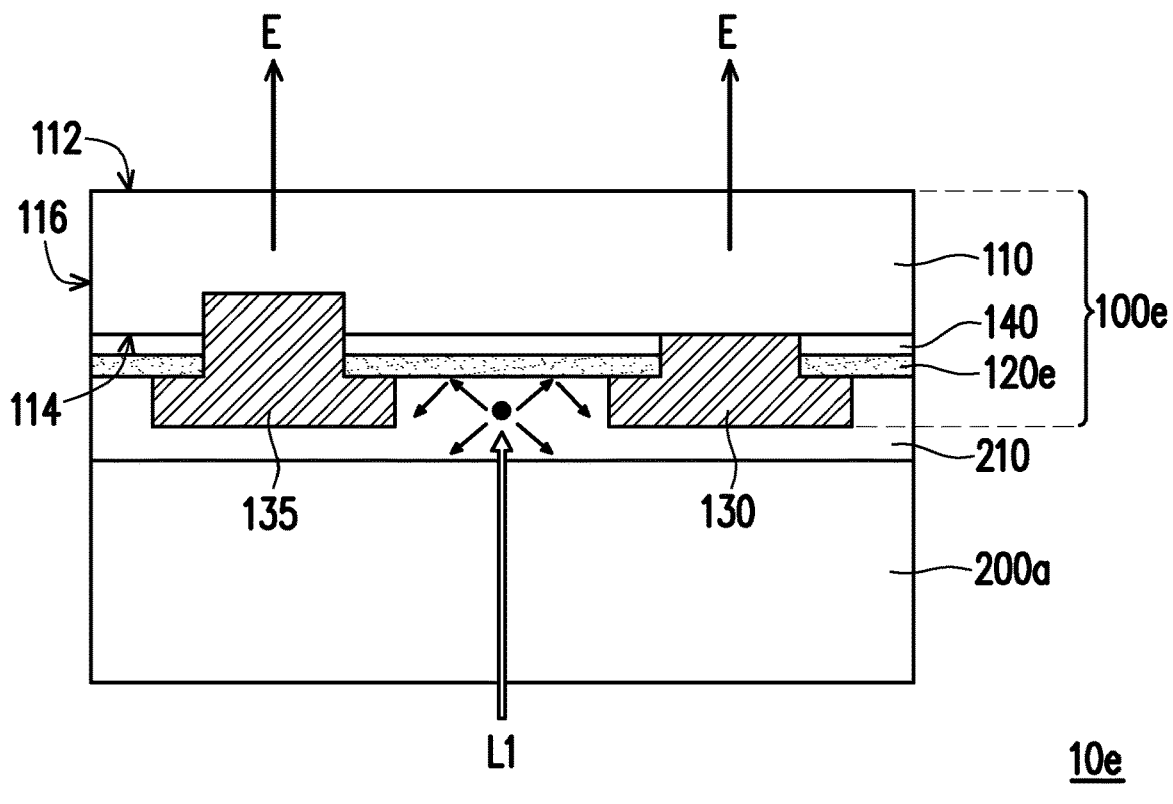
FIG. 5 is a cross-sectional schematic view of a micro semiconductor structure according to another embodiment of the disclosure.

FIG. 5 is a cross-sectional schematic view of a micro semiconductor structure according to another embodiment of the disclosure. Referring to FIG. 1A and FIG. 5 at the same time, the micro semiconductor structure 10*e* of this embodiment is similar to the micro semiconductor structure 10*a* of FIG. 1A, and the difference between the two is that in this embodiment, the optical layer 120*e* of the micro semiconductor device 100*e* is disposed on the lower surface 114 (i.e., electrode surface). The protective layer 140 is located between the epitaxial structure 110 and the optical layer 120*e*. In terms of fabrication, after the protective layer 140 is formed in the wafer process, the optical layer 120*e* may be fabricated through a physical or chemical vapor deposition process. Afterwards, in the laser transfer process, the external light L1 (i.e. ultraviolet laser) may separate the sacrificial layer 210 and the substrate 200*a* thereon from the optical layer 120*e*. The optical layer 120*e* may minimize the impact of laser scattered light to ensure the characteristics of the epitaxial structure 110, so that the micro semiconductor structure 10*e* of the disclosure has better structural reliability.

Figure 6:
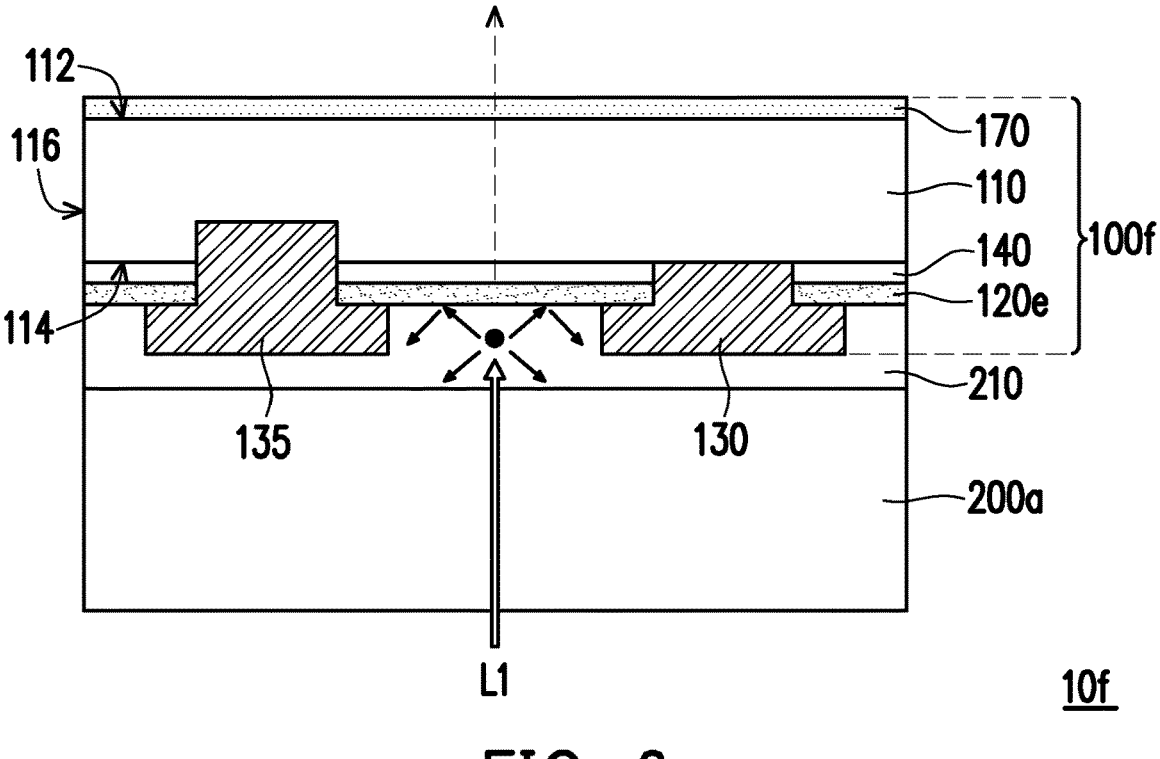
FIG. 6 is a cross-sectional schematic view of a micro semiconductor structure according to another embodiment of the disclosure.

FIG. 6 is a cross-sectional schematic view of a micro semiconductor structure according to another embodiment of the disclosure. Referring to FIG. 5 and FIG. 6 at the same time, the micro semiconductor structure 10*f* of this embodiment is similar to the micro semiconductor structure 10*e* of FIG. 5, and the difference between the two is that in this embodiment, the micro semiconductor device 100*f* further includes an external light transmitting layer 170 disposed on the upper surface 112 (i.e., light-emitting surface). Since the optical layer 120*e* of this embodiment is disposed on the electrode surface of the epitaxial structure 110 (i.e., lower surface 114), and the external light transmitting layer 170 is disposed on the light-emitting surface of the epitaxial structure 110 (i.e., upper surface 112), the external light L1 (e.g., ultraviolet laser in ultraviolet light band) that has entered the epitaxial structure 110 may be released and not reflected in again.

Figure 7:
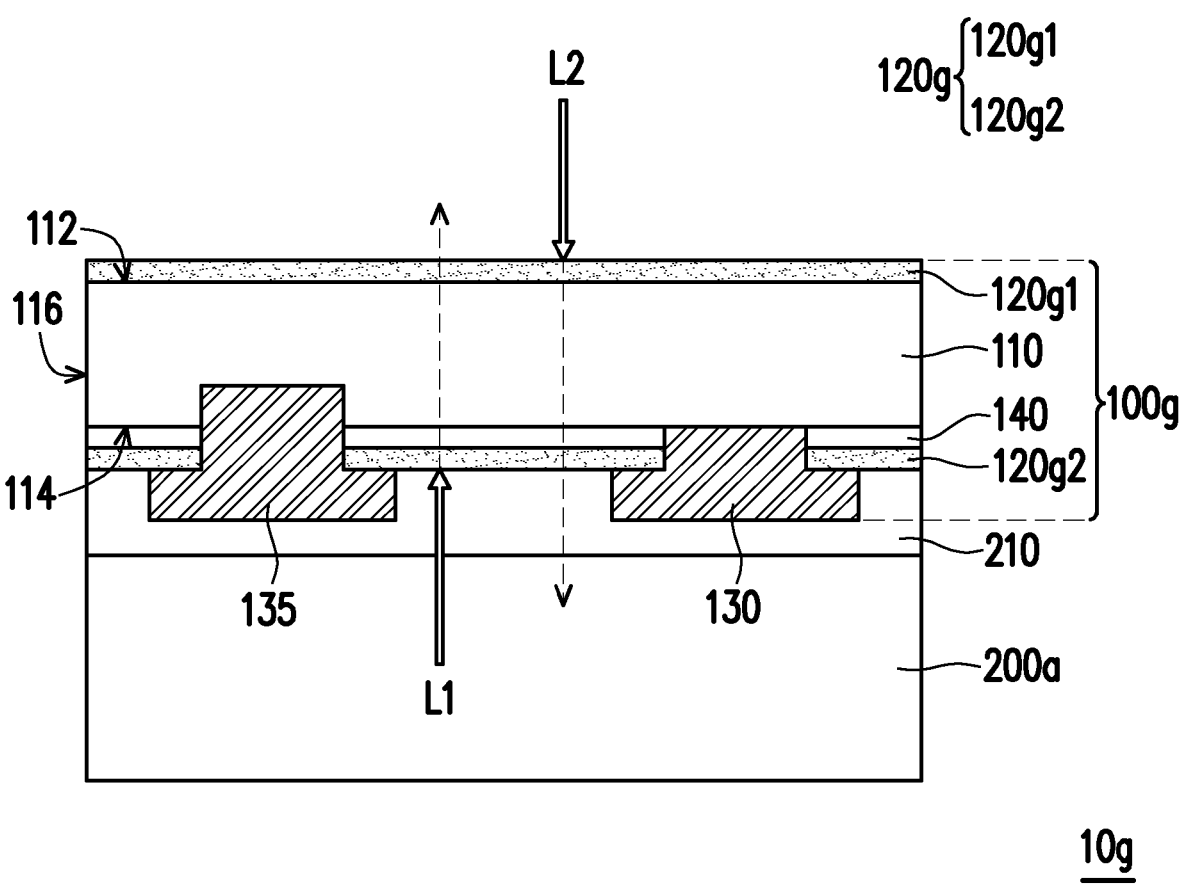
FIG. 7 is a cross-sectional schematic view of a micro semiconductor structure according to another embodiment of the disclosure.

FIG. 7 is a cross-sectional schematic view of a micro semiconductor structure according to another embodiment of the disclosure. Referring to FIG. 5 and FIG. 7 at the same time, the micro semiconductor structure 10*g* of this embodiment is similar to the micro semiconductor structure 10*e* of FIG. 5, and the difference between the two is that in this embodiment, the optical layer 120*g* of the micro semiconductor device 100*g* includes a first sub-optical layer 120*g*1 and a second sub-optical layer 120*g*2. The first sub-optical layer 120*g*1 is located on the upper surface 112 of the epitaxial structure 110, and the second sub-optical layer 120*g*2 is located on the lower surface 114 of the epitaxial structure 110. The external light L1 and the external light L2 reflected by the first sub-optical layer 120*g*1 and the second sub-optical layer 120*g*2 have different wavelengths, for example, different wavelengths of ultraviolet light bands. That is, this embodiment may be used in the lift-off process of different sides. The first sub-optical layer 120*g*1 is disposed on the upper surface 112, which may only reflect the external light L2 and allow the external light L1 entering the epitaxial structure 110 to pass through. The second sub-optical layer 120*g*2 is disposed on the lower surface 114, which may only reflect the external light L1 and allow the external light L2 entering the epitaxial structure 110 to pass through. In an embodiment, the wavelength of the external light L1 may be between the wavelength of the external light L2 and the wavelength of the visible light.

Figure 8:
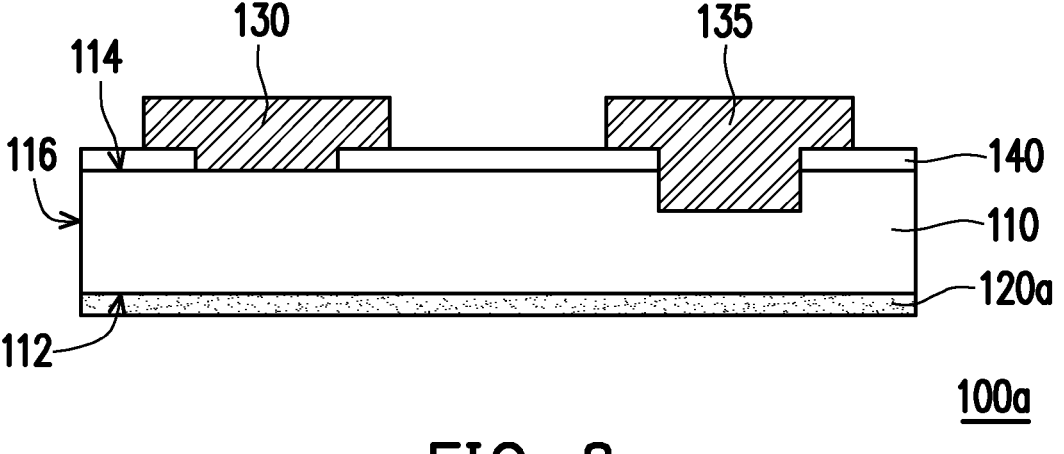
FIG. 8 is a cross-sectional schematic view of a micro semiconductor device according to an embodiment of the disclosure.

FIG. 8 is a cross-sectional schematic view of a micro semiconductor device according to an embodiment of the disclosure. Referring to FIG. 1A and FIG. 8 at the same time, the micro semiconductor device 100*a* of this embodiment is the micro semiconductor structure 10*a* of FIG. 1A with the substrate 200*a* and the sacrificial layer 210 removed. The optical layer 120*a* is disposed on the epitaxial structure 110. The reflectivity of the optical layer 120*a* to the external light L1 of the micro semiconductor device 100*a* is greater than the self-luminescence E of the epitaxial structure 110 of the micro semiconductor device 100*a*. Thus, the characteristics of the epitaxial structure 110 is not affected by the external light L1, so that the micro semiconductor device 100*a* of this embodiment has better structural reliability.

Figure 9:
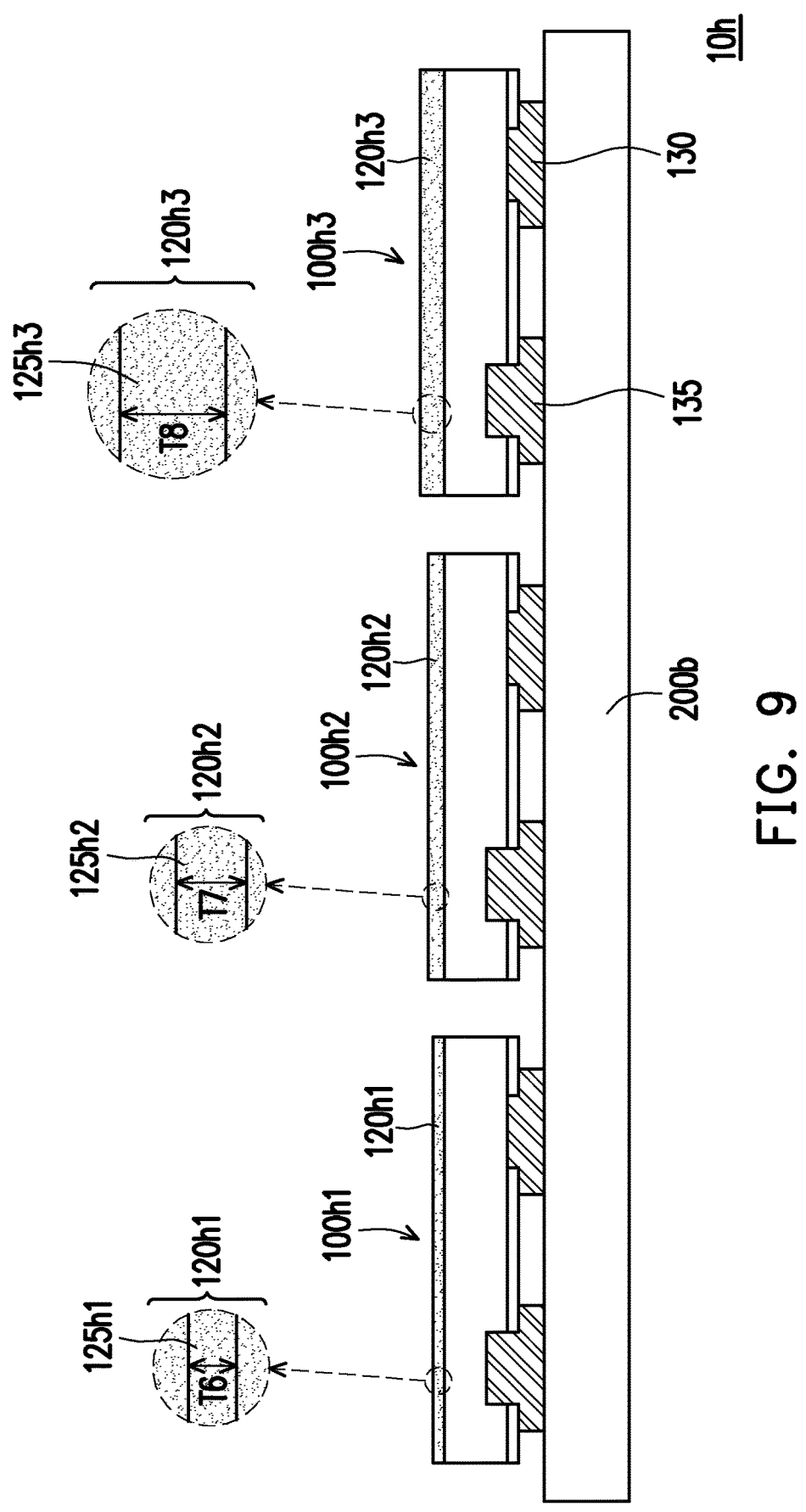
FIG. 9 is a cross-sectional schematic view of a micro semiconductor structure according to another embodiment of the disclosure.

FIG. 9 is a cross-sectional schematic view of a micro semiconductor structure according to another embodiment of the disclosure. Referring to FIG. 1A and FIG. 9 at the same time, the micro semiconductor structure 10*h* of this embodiment is similar to the micro semiconductor structure 10*a* of FIG. 1A, and the difference between the two is that in this embodiment, the substrate 200*b* is a circuit substrate, and the micro semiconductor devices includes a micro semiconductor device 100*h*1, a micro semiconductor device 100*h*2, and a micro semiconductor device 100*h*3 with light in different colors. The micro semiconductor device 100*h*1, the micro semiconductor device 100*h*2, and the micro semiconductor device 100*h*3 are electrically connected with the substrate 200*b* by flip-chip bonding technique. In other words, the micro semiconductor structure 10*h* of this embodiment is embodied as a display apparatus. The micro semiconductor device 100*h*1, the micro semiconductor device 100*h*2, and the micro semiconductor device 100*h*3 with light in different colors herein includes an optical layer 120*h*1, an optical layer 120*h*2, and an optical layer 120*h*3 of different thicknesses, respectively, due to different wavelengths of emitted light. Specifically, in this embodiment, the optical layer 120*h*1, the optical layer 120*h*2, and the optical layer 120*h*3 include an optical stacking layer 125*h*1, an optical stacking layer 125*h*2, and an optical stacking layer 125*h*3 with different numbers of layers, respectively, and thus have a thickness T6, a thickness T7, and a thickness T8, respectively.

To sum up, in the micro semiconductor device of the disclosure, the optical layer is disposed on the epitaxial structure. A reflectivity of the optical layer to an external light of the micro semiconductor device is greater than a self-luminescence of the epitaxial structure of the micro semiconductor device. In this way, the impact of external light on the epitaxial structure may be minimized to ensure the characteristics of the epitaxial structure, so that the micro semiconductor device of the disclosure has better structural reliability.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A micro semiconductor device, comprising:

an epitaxial structure; and an optical layer, disposed on the epitaxial structure, wherein the optical layer is a multi-layer film structure comprising a first film layer, a second film layer, and a third film layer disposed between the first film layer and the second film layer, wherein a refractive index of the first film layer and a refractive index of the second film layer are both greater than a refractive index of the third film layer, a thickness of the third film layer is greater than a thickness of the first film layer and a thickness of the second film layer, and a reflectivity of the optical layer to an external light of the micro semiconductor device is greater than a self-luminescence of the epitaxial structure of the micro semiconductor device, wherein the optical layer further comprises an optical stacking layer disposed between the first film layer and the second film layer, the optical stacking layer comprises at least one high refractive index layer and at least one low refractive index layer disposed in pairs and alternately, a thickness of the at least one low refractive index layer is greater than a thickness of the at least one high refractive index layer, wherein the thickness of the first film layer or the thickness of the second film layer is 60% or less of the thickness of the at least one high refractive index layer.

2. The micro semiconductor device according to claim 1, wherein a reflectivity of the external light is greater than twice a reflectivity of the self-luminescence.

3. The micro semiconductor device according to claim 2, wherein a wavelength of the external light is from 240 nanometers to 400 nanometers.

4. The micro semiconductor device according to claim 2, wherein the optical layer has a cut-off wavelength from 380 nanometers to 440 nanometers.

5. The micro semiconductor device according to claim 1, wherein the epitaxial structure has an upper surface and a lower surface opposite to each other and a peripheral surface connecting the upper surface and the lower surface, and the self-luminescence emerges from the upper surface, wherein the optical layer is disposed on the upper surface, the lower surface, or a combination of the upper surface and the lower surface.

6. The micro semiconductor device according to claim 5, further comprising:

a visible light reflective layer, disposed on the upper surface of the epitaxial structure with the optical layer disposed on the lower surface, or, disposed on the lower surface of the epitaxial structure with the optical layer disposed on the upper surface.

7. The micro semiconductor device according to claim 5, further comprising:

an external light transmitting layer, disposed on the upper surface of the epitaxial structure with the optical layer disposed on the lower surface, or, disposed on the lower surface of the epitaxial structure with the optical layer disposed on the upper surface.

8. The micro semiconductor device according to claim 5, wherein the optical layer comprises a first sub-optical layer and a second sub-optical layer, the first sub-optical layer and the second sub-optical layer are located on the upper surface and the lower surface, respectively, and the external light reflected by the first sub-optical layer and the second sub-optical layer has different wavelengths.

9. A micro semiconductor structure, comprising:

a substrate; and at least one micro semiconductor device, disposed on the substrate, wherein the at least one micro semiconductor device comprises:

an epitaxial structure; and an optical layer, disposed on the epitaxial structure, wherein the optical layer is a multi-layer film structure comprising a first film layer, a second film layer, and a third film layer disposed between the first film layer and the second film layer, wherein a refractive index of the first film layer and a refractive index of the second film layer are both greater than a refractive index of the third film layer, a thickness of the third film layer is greater than a thickness of the first film layer and a thickness of the second film layer, and a reflectivity of the optical layer to an external light of the micro semiconductor device is greater than a self-luminescence of the epitaxial structure of the micro semiconductor device, wherein the optical layer further comprises an optical stacking layer disposed between the first film layer and the second film layer, the optical stacking layer comprises at least one high refractive index layer and at least one low refractive index layer disposed in pairs and alternately, a thickness of the at least one low refractive index layer is greater than a thickness of the at least one high refractive index layer, wherein the thickness of the first film layer or the thickness of the second film layer is 60% or less of the thickness of the at least one high refractive index layer.

10. The micro semiconductor structure according to claim 9, further comprising:

a sacrificial layer, disposed between the optical layer and the substrate, wherein the substrate is a temporary substrate, and a Young's modulus of the optical layer is greater than a Young's modulus of the sacrificial layer.

11. The micro semiconductor structure according to claim 9, wherein the substrate is a circuit substrate, the at least one micro semiconductor device is a plurality of micro semiconductor devices with light in different colors, and the micro semiconductor devices with light in different colors comprise the optical stacking layer with different thicknesses, respectively.

\* \* \* \* \*